(12) United States Patent
Hu

(10) Patent No.: US 10,815,122 B2
(45) Date of Patent: Oct. 27, 2020

(54) MEMS MICROPHONE AND PREPARATION METHOD THEREOF

(71) Applicant: CSMC TECHNOLOGIES FAB2 CO., LTD., Wuxi New District (CN)

(72) Inventor: Yonggang Hu, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/305,119

(22) PCT Filed: May 26, 2017

(86) PCT No.: PCT/CN2017/086158
§ 371 (c)(1),
(2) Date: Nov. 28, 2018

(87) PCT Pub. No.: WO2017/206813
PCT Pub. Date: Dec. 7, 2017

(65) Prior Publication Data
US 2020/0010316 A1    Jan. 9, 2020

(30) Foreign Application Priority Data
Jun. 3, 2016 (CN) .......................... 2016 1 0389572

(51) Int. Cl.
*B81B 7/02* (2006.01)
*H04R 7/06* (2006.01)
(Continued)

(52) U.S. Cl.
CPC ............ *B81C 1/00158* (2013.01); *B81B 7/02* (2013.01); *H04R 7/06* (2013.01); *H04R 19/04* (2013.01); *B81B 2201/0257* (2013.01)

(58) Field of Classification Search
CPC .................... H04R 17/06; H04R 19/04; B81B 2201/0257; B81C 1/00158
See application file for complete search history.

(56) References Cited

U.S. PATENT DOCUMENTS 7,772,077 B2 *  8/2010  Gehring ................ H01L 21/268
                                                 257/E21.324
8,921,956 B2 * 12/2014  Dehe ....................... B81B 3/007
                                                 257/416
(Continued)

FOREIGN PATENT DOCUMENTS

CN         1636728 A      7/2005
CN         1960581 A      5/2007
(Continued)

OTHER PUBLICATIONS

Unpublished U.S. Appl. No. 15/770,624, filed Apr. 24, 2018 (14 pages).
(Continued)

*Primary Examiner* — Regina N Holder
(74) *Attorney, Agent, or Firm* — Kagan Binder, PLLC

(57) ABSTRACT

A MEMS microphone comprises a substrate (110), a lower electrode layer (120), a sacrificial layer (130), a stress layer (140), and an upper electrode layer (150). The substrate (110) is centrally provided with a first opening (111), and the lower electrode layer (120) stretches across the substrate (110). The sacrificial layer (130), the stress layer (140), and the upper electrode layer (150) are sequentially laminated on the lower electrode layer (120), and a second opening (160) is provided on the sacrificial layer (130) and the stress layer (140). The second opening (160) is provided in correspondence with the first opening (111). A stress direction of the stress layer (140) is reverse to a warpage direction of the substrate (110).

19 Claims, 8 Drawing Sheets

(51) Int. Cl.
*H04R 19/04* (2006.01)
*B81C 1/00* (2006.01)

(56) References Cited

U.S. PATENT DOCUMENTS

| | | | |
|---|---|---|---|
| 9,620,615 B2 | 4/2017 | Deng et al. | |
| 9,673,193 B2 | 6/2017 | Zhang et al. | |
| 9,862,595 B2 | 1/2018 | Jing | |
| 9,947,785 B2 | 4/2018 | Han et al. | |
| 9,952,609 B2 | 4/2018 | Zhang et al. | |
| 9,953,970 B2 | 4/2018 | Zhang et al. | |
| 9,954,074 B2 | 4/2018 | Zhong et al. | |
| 9,975,766 B2 | 5/2018 | Hu et al. | |
| 9,977,342 B2 | 5/2018 | Yao | |
| 10,014,392 B2 | 7/2018 | Qi et al. | |
| 10,101,225 B2 | 10/2018 | Qian | |
| 2009/0309171 A1 | 12/2009 | Schrank | |
| 2014/0116986 A1* | 5/2014 | Akasaka | G02B 3/0075 216/26 |
| 2014/0210020 A1 | 7/2014 | Dehe | |
| 2015/0021722 A1 | 1/2015 | Dehe et al. | |
| 2015/0108504 A1* | 4/2015 | Watanabe | H01L 21/02447 257/77 |
| 2015/0170928 A1* | 6/2015 | Nakayama | H01L 21/02013 428/141 |
| 2016/0167946 A1* | 6/2016 | Jenkins | B81B 3/0072 257/416 |
| 2016/0233216 A1 | 8/2016 | Zhang et al. | |
| 2017/0011144 A1 | 1/2017 | Hu et al. | |
| 2017/0011957 A1 | 1/2017 | Wang et al. | |
| 2017/0053832 A1* | 2/2017 | Wan | H01L 21/78 |
| 2017/0205470 A1 | 7/2017 | Li et al. | |
| 2018/0130877 A1 | 5/2018 | Huang et al. | |
| 2018/0139544 A1 | 5/2018 | Hu | |
| 2018/0252996 A1 | 9/2018 | Wan et al. | |
| 2018/0342609 A1 | 11/2018 | Qi et al. | |
| 2018/0358390 A1 | 12/2018 | Liu et al. | |

FOREIGN PATENT DOCUMENTS

| | | |
|---|---|---|
| CN | 103964368 A | 8/2014 |
| CN | 104867826 A | 8/2015 |
| EP | 1771036 A2 | 4/2007 |
| JP | 2008016919 A | 1/2008 |
| JP | 2008259061 A | 10/2008 |
| JP | 2011055087 A | 3/2011 |
| JP | 2011124771 A | 6/2011 |
| JP | 2012045659 A | 3/2012 |
| KR | 1020110076074 A | 7/2011 |
| WO | 2009037458 A2 | 3/2009 |

OTHER PUBLICATIONS

Office Action for Chinese Application No. 201610389572.2, dated Mar. 19, 2019 (7 pages).

International Search Report for International Application No. PCT/CN2017/086158, dated Aug. 30, 2017 (10 pages).

Extended European Search Report for European Application No. 17805758.4, dated Dec. 20, 2019 (7 pages).

Japanese Office Action for Japanese Application No. 2018-563101, dated Mar. 3, 2020 (4 pages).

* cited by examiner

MEMS MICROPHONE AND PREPARATION METHOD THEREOF

TECHNICAL FIELD

The present disclosure relates to semiconductor device technology, and particularly relates to an MEMS microphone and a method of manufacturing the same.

BACKGROUND

A Micro-Electro-Mechanical System (MEMS) device, including a silica-based microphone, is usually manufactured by way of integrated circuit manufacturing technology. Silica-based microphones have broad application prospects in areas such as hearing aids and mobile communication devices. MEMS microphone chips have been researched for more than 20 years. During this period, many types of microphone chips have been developed, including piezoresistive, piezoelectric, and capacitive, among which capacitive MEMS microphones are the most widely used. Capacitive MEMS microphones have the following advantages: small size, high sensitivity, favorable frequency characteristics, and low noise and so on.

In the manufacturing process of MEMS microphones, the process is usually performed only on one side of the semiconductor substrate (e.g., film deposition, etching, etc.) while on the other side the process is not performed. Usually, a very thick layer of silicon oxide is formed on the diaphragm or the back plate serving as a sacrificial layer, typically with a thickness of 3 to 5 µm. Then a back plate or a diaphragm is formed on the sacrificial layer, and finally the sacrificial layer is etched away to form a cavity between the back plate and the diaphragm. This very thick sacrificial layer can cause severe distortion of the MEMS microphone semiconductor substrate. As there are strict requirements on the deformation of the semiconductor substrate in the semiconductor manufacturing process, such as a photolithography process, if the semiconductor substrate is severely deformed, subsequent processes cannot be performed, resulting that the MEMS microphone production cannot carry on.

In order to address the warpage problem of e semiconductor substrate, typically a film layer is also deposited on the other side of the semiconductor substrate or an etching process is performed. However, this may cause one side of the semiconductor substrate of the MEMS microphone device to be in contact with the semiconductor device, such that the MEMS microphone device is scratched or contaminated, whereby the yield of the MEMS microphone is affected and the manufacturing cost is also increased. Additionally, due to limitations in the production process, the backside film layer cannot always be maintained on the backside of the semiconductor substrate. Once the film on the back side is removed, the semiconductor substrate will be deformed again.

SUMMARY

Accordingly, it is necessary to provide an MEMS microphone and a manufacturing method thereof that can decrease or eliminate the deformation of the substrate and have a high yield.

An MEMS microphone includes a substrate, a lower electrode layer, a sacrificial layer, a stress layer, and an upper electrode layer; the substrate defines a first opening in a middle portion thereof, the lower electrode layer spans the substrate; the sacrificial layer, the stress layer, and the upper electrode layer are sequentially laminated on the lower electrode layer; the sacrificial layer and the stress layer define a second opening corresponding to the first opening; a stress direction of the stress layer is opposite to a warping direction of the substrate.

Additionally, a method of manufacturing an MEMS microphone is also provided, which includes:
depositing a lower electrode layer, a sacrificial layer, and a stress layer sequentially on a substrate, wherein a stress direction of the stress layer is opposite to a warp direction of the substrate;
forming a vibration active region of an upper electrode layer on the stress layer;
depositing an upper electrode layer on the stress layer;
defining a first opening on the substrate; and
defining a second opening on the sacrificial layer corresponding to the vibration active area, wherein the second opening corresponds to the first opening.

Additionally, a method of manufacturing an MEMS microphone is also provided, which includes:
depositing a lower electrode layer, a sacrificial layer, and a stress layer sequentially on a substrate, wherein a stress direction of the stress layer is opposite to a warp direction of the substrate;
forming a vibration active region of the lower electrode layer on the stress layer;
depositing an upper electrode layer on the stress layer;
defining a first opening on the substrate; and
defining a second opening on the sacrificial layer corresponding to the vibration active area, wherein the second opening is corresponding to the first opening.

The above MEMS microphone includes a substrate, a lower electrode layer, a sacrificial layer, a stress layer, and an upper electrode layer.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Figure 1:
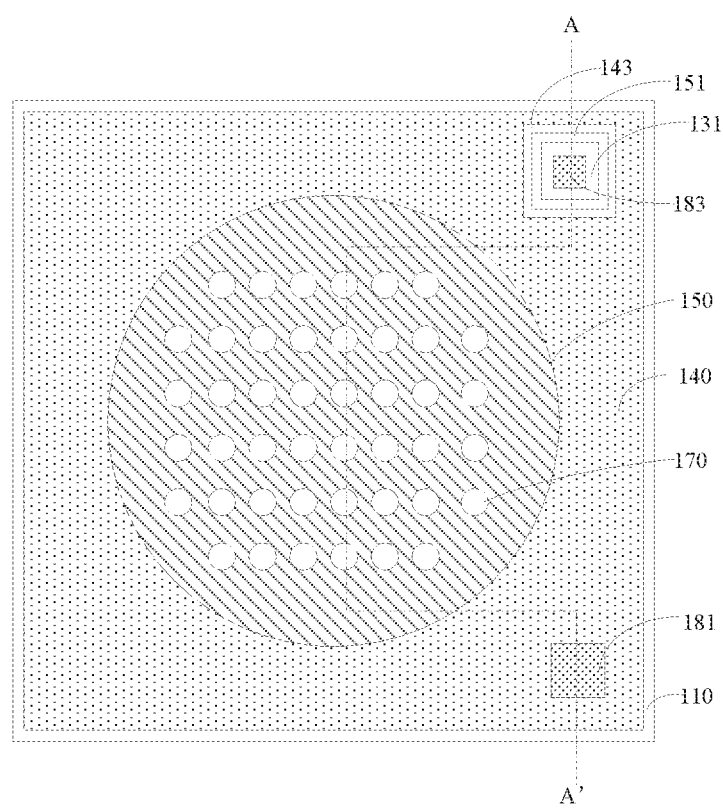
FIG. 1 is a top plan view of an MEMS microphone in an embodiment.

Embodiments of the disclosure are described more comprehensively hereinafter with reference to the accompanying drawings. Preferable embodiments are presented in the drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

Figure 2:
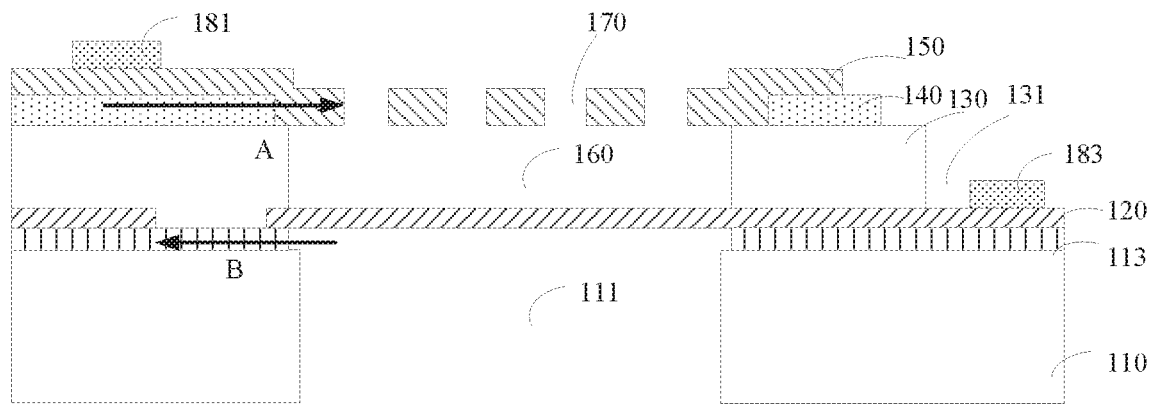
FIG. 2 is a cross-sectional view taken along line A-A' of FIG. 1.

FIG. 1 is a top plan view of an MEMS microphone in an embodiment; FIG. 2 is a side cross-sectional view taken along line A-A' of FIG. 1.

An MEMS microphone includes a substrate 110, a lower electrode layer 120, a sacrificial layer 130, a stress layer 140, and an upper electrode layer 150.

In the illustrated embodiment, the substrate 110 is made of Si, and the substrate 110 may also be made of other semiconductors or semiconductor compounds, such as one of Ge, SiGe, SiC, $SiO_2$, or $Si_3N_4$. The middle portion of the base plate 110 is provided with a first opening 111. The first opening 111 is also called a back cavity. The substrate 110 may also be provided with an insulating layer 113. The insulating layer 113 is a silicon oxide layer. The insulating layer 113 serves as a stop layer for etching the back cavity 111 at the same time. The lower electrode layer 120 spans and is connected to the insulating layer 113. The insulating layer 113 serves to insulate the substrate 110 and the lower electrode layer 120 from each other, The lower electrode layer 120 spans the substrate 110. The sacrificial layer 130, the stress layer 140, and the upper electrode layer 150 are sequentially laminated on the lower electrode layer 120. A second opening 160 is defined on the sacrificial layer 130 and the stress layer 140. The second opening 160 is corresponding to the first opening 111. Here, the stress direction of the stress layer 140 is opposite to the warp direction of the substrate 110. The direction of the arrow A in FIG. 2 indicates the direction of the force of the stress layer 140, and the direction of the arrow B in FIG. 2 indicates the direction of the force of the film layer that causes warping of the wafer, that is, the direction of the force of the warpage of the substrate 110.

The thickness of the stress layer 140 matches the warpage of the substrate 110. The warpage or warp is used to describe the degree of bending of the plane in space and is numerically defined as the distance between the furthest two points of the warping plane in the height direction. The warpage of the absolute plane is 0. The upper electrode layer 150 and the lower electrode layer 120 are insulated from each other.

Upon matching of the stress layer 140 with the stress of the film layer (substrate 110) which causes the warpage of the substrate, the warpage of the substrate 110 can be reduced or eliminated. The stress σ of the stress layer 140 multiplied by the thickness t can roughly indicate the magnitude of the force generated by the stress layer 140 on the wafer, which is represented with σ×t. The stress of other layers can also be roughly calculated accordingly. Adjusting the stress and thickness of the stress layer 140 can reduce or eliminate the warpage of the substrate 110.

Referring to FIGS. 1 and 2, the lower electrode layer 120 is a flexible film serving as a diaphragm, the upper electrode layer 150 is a rigid film serving as a back plate. The lower electrode layer (diaphragm) 120 is a flexible film that has tensile stress and is conductive. When the ambient air is vibrated, the diaphragm can deform to a certain degree, so as to form a flat plate capacitor together with the upper electrode layer (back plate) 150, as an electrode of the plate capacitor. The upper electrode layer (back plate) 150 is a conductive, rigid film, and a plurality of acoustic holes 170 with specific size are formed on the upper electrode layer (back plate) 150. The sound can be conducted through the acoustic holes 170 to the lower electrode layer (diaphragm) 120. The acoustic holes 170 are uniformly distributed on the upper electrode layer (back plate) 150. Of course, the acoustic holes 170 may also be non-uniformly distributed. For example, the acoustic holes 170 may be relatively dense in the middle region of the upper electrode layer (back plate) 150.

The lower electrode layer 120 and the upper electrode layer 150 are both conductive layers. In the illustrated embodiment, the lower electrode layer 120 and the upper electrode layer 150 are both polysilicon layers. During depositing polysilicon and forming the polysilicon layer, the process parameters of the polysilicon deposition, the thickness thereof, the doping amount of impurities, and the like can be changed to form the lower electrode layer 120 and the upper electrode layer 150 that are flexible or rigid. In other embodiments, the electrode plate 120 and the upper electrode layer 150 may also be a composite layer structure including a conductive layer, for example, containing Si, Ge, SiGe, SiC, or Al, W, Ti, or one of the nitrides of Al, W, Ti.

Figure 3:
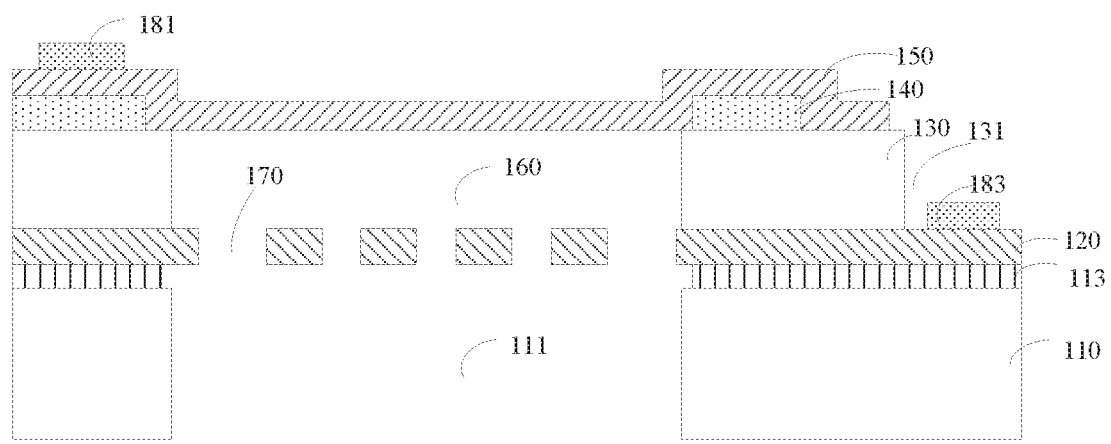
FIG. 3 is a cross-sectional view of an MEMS microphone in another embodiment.

In another embodiment, referring to FIG. 3, the lower electrode layer 120 is a rigid film serving as a back plate, the upper electrode layer 150 is a flexible film serving as a diaphragm. Correspondingly, a plurality of acoustic holes 170 with specific size are formed on the lower electrode layer 120. The sound can be conducted through the acoustic holes 170 to the upper electrode layer (diaphragm) 150. The acoustic holes 170 are uniformly distributed on the lower electrode layer (back plate) 120. Of course, the acoustic holes 170 may also be non-uniformly distributed. For example, the acoustic holes 170 may be relatively dense in the middle region of the lower electrode layer 120.

The sacrificial layer 130, the stress layer 140, and the upper electrode layer 150 are sequentially laminated on the lower electrode layer 120. The second opening 160 is defined on the sacrificial layer 130 and the stress layer 140, so that the lower electrode layer 120, the sacrificial layer 130, the stress layer 140, and the upper electrode layer 150 are enclosed to form a cavity. The cavity is actually released from the sacrificial layer 130. During the release, the sacrificial layer 130 is etched away to form a cavity.

Since the thickness of the sacrificial layer of the MEMS microphone is usually in the range of 3 to 5 μm, the sacrificial layer 130 with such a thickness may cause severe deformation of the MEMS microphone semiconductor substrate 110. The stress magnitude of the stress layer 140 or the film thickness of the stress layer 140 may be controlled according to the actual degree of warping or deformation of the substrate 110, such that the thickness of the stress layer 140 matches the warpage of the substrate 110. In other words, by changing the thickness and stress value of the stress layer 140, a force opposite to the direction of deformation of the substrate 110 may be applied to the substrate 110, so as to reduce or eliminate the deformation of the substrate 110. In the illustrated embodiment, the stress layer 140 is a silicon nitride ($Si_3N_4$) layer, because the stress direction of the silicon nitride ($Si_3N_4$) layer is opposite to the stress that causes the substrate 110 to warp.

The stress layer 140 is typically located at the periphery of a vibration active area of the upper electrode layer 150 or the lower electrode layer 120, so as not to affect the stress level of the diaphragm or the back plate. The vibration active area of the upper electrode layer 150 or the lower electrode layer 120 refers to a position corresponding to the second opening 160.

The sacrificial layer 130 is a polysilicon layer, and the sacrificial layer 130 is provided with a notch 131 for exposing the lower electrode layer 120 below the sacrificial layer 130. In this embodiment, the notch 131 is a through hole structure.

The MEMS microphone also includes a first pad 181 disposed on a side of the upper electrode layer 150, and a second pad 183 disposed on the exposed lower electrode 120. The first pad 181 and the second pad 183 are both made of metal, and the first pad 181 and the second pad 183 are used to connect the lower electrode layer 120 and the upper electrode layer 150, meanwhile, the first pad 181 and the second pad 183 can also be used for subsequent capacitive silica-based microphone packaging wiring. It should be understood that, FIGS. 1 to 4 only illustrate simple examples of some major structures of the MEMS microphone and do not represent the entire structure of the device.

Figure 4:
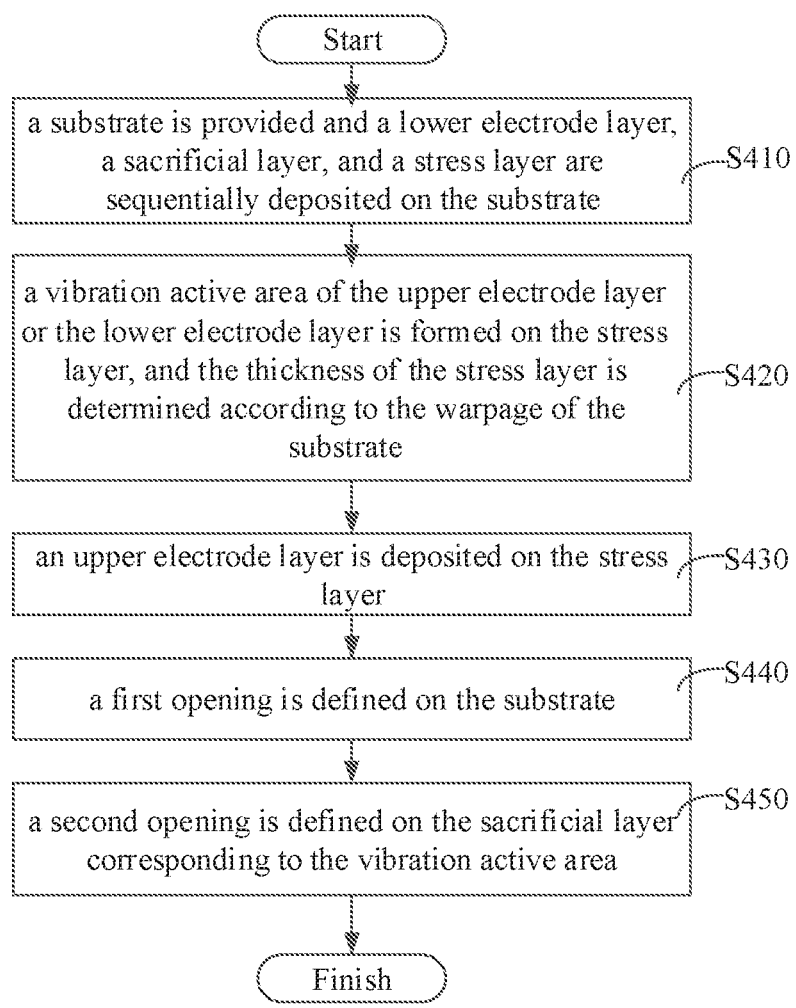
FIG. 4 is a flowchart of a method of manufacturing the MEMS microphone in an embodiment.

FIG. 4 is a flowchart of a method of manufacturing the MEMS microphone. A specific process flow will be described below with reference to FIGS. 5 to 12. The foregoing method of manufacturing the MEMS microphone includes:

In step S410, a lower electrode layer, a sacrificial layer, and a stress layer are sequentially deposited on the substrate.

Figure 5:
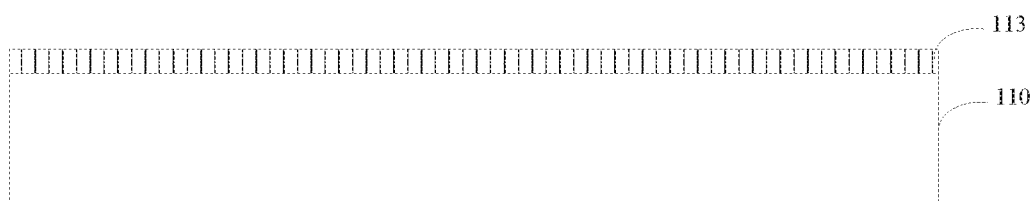
FIGS. 5-12 are cross-sectional views illustrating the manufacturing process of the MEMS microphone in an embodiment.
Figure 6:
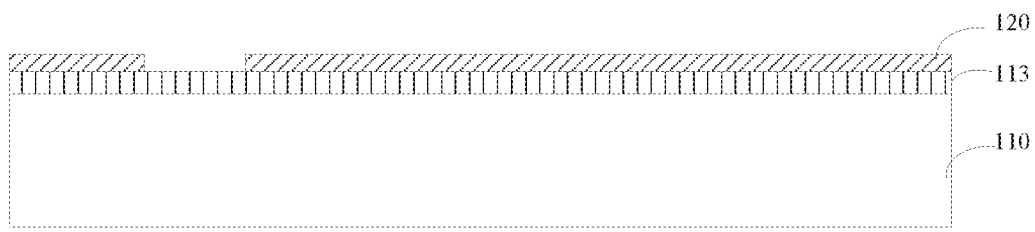
Figure 7:
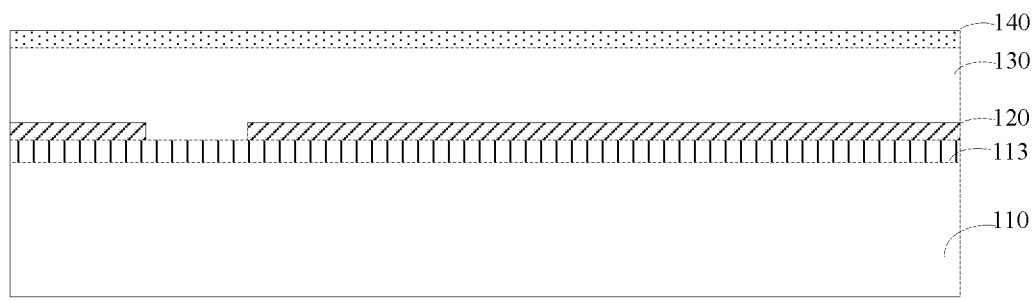

Referring to FIG. 5 to FIG. 7, in the illustrated embodiment, the substrate 110 is made of Si. In other embodiments, the substrate 110 may also be made of other semiconductors or semiconductor compounds, such as one of Ge, SiGe, SiC, $SiO_2$, or $Si_3N_4$. A silicon oxide insulating layer 113 is formed on the surface (first main surface) of the substrate 110 by thermal growth, and the thickness of the silicon oxide insulating layer 113 is between 0.5 μm and 1 μm. Next, the polysilicon is deposited on the surface of the silicon oxide insulating layer 113 to form the lower electrode layer 120. At this time, the lower electrode layer 120 is a flexible film and the lower electrode layer 120 serves as a diaphragm of the MEMS microphone. In other embodiments, the lower electrode layer 120 may also be a composite conductive layer containing Si, Ge, SiGe, SiC, or Al, W, Ti, or nitrides of Al, W, Ti.

The photolithography and etching steps are then followed to form the desired pattern of the lower electrode layer (diaphragm) 120; an oxide layer is then deposited over the lower electrode layer 120 serving as a sacrificial layer 130; and a layer of nitride is deposited over the sacrificial layer 130 to serve as the stress layer 140. Since the thickness of the sacrificial layer of the MEMS microphone is usually in the range of 3 to 5 μm, sacrificial layer 130 with such a thickness will cause severe deformation of the MEMS microphone semiconductor substrate 110. In the process of preparation, the press of the stress layer 140 or the film thickness of the stress layer 140 can be controlled according to the warpage or the deformation of the substrate 110. In other words, by changing the thickness and the stress of the stress layer 140, a force opposite to the direction of the deformation of the substrate may be applied to the substrate so as to reduce or eliminate the deformation of the substrate. The stress layer 140 is a silicon nitride ($Si_3N_4$) layer, and the stress direction of the silicon nitride ($Si_3N_4$) layer is opposite to the stress that causes the substrate 110 to warp. The stress of the stress layer 140 may be adjusted by adjusting deposition process parameters such as temperature, pressure, gas volume (total reaction gas volume and ratio of reactant gas components), radio frequency power and frequency, and the like in depositing.

In step S420: a vibration active region of the lower electrode layer is formed in the stress layer.

Figure 8:
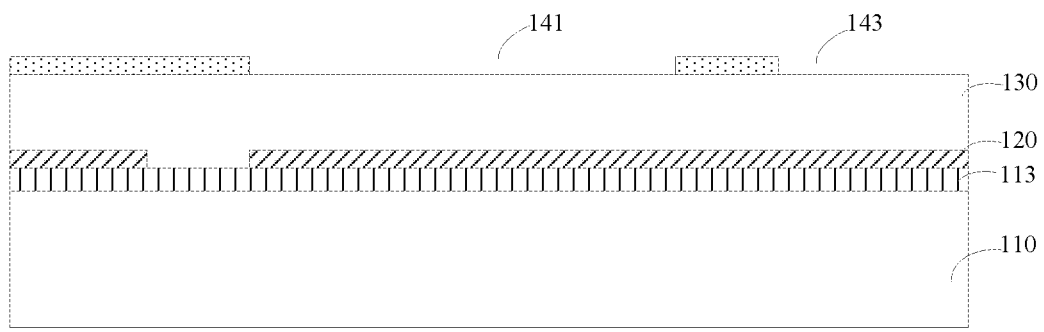

Referring to FIG. 8, through photolithography and etching steps, the vibration active region 141 of the lower electrode layer (diaphragm) 120 is formed on the stress layer 140, and the first through hole 143 is formed by etching. The vibration active region can be interpreted as a space to allow the lower electrode layer 120 serving as a diaphragm in the MEMS microphone to be deformed to a certain degree when the surrounding air vibrates.

In step S430, an upper electrode layer is deposited on the stress layer.

Figure 9:
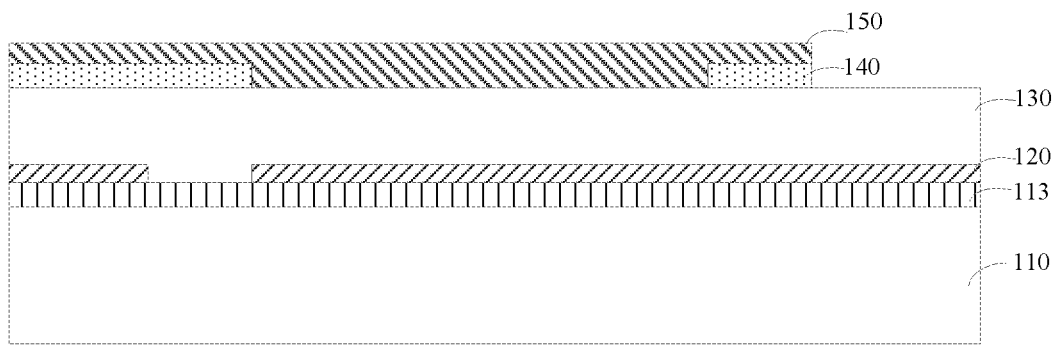
Figure 10:
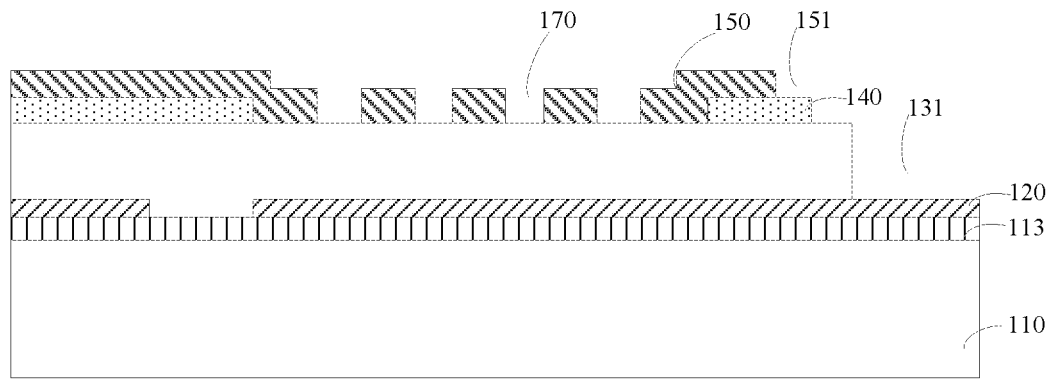
Figure 11:
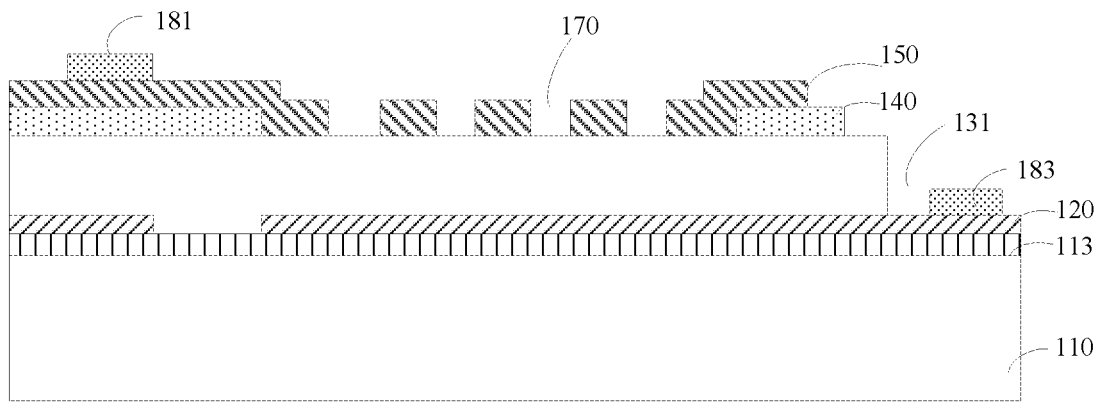

Referring to FIGS. 9 to 11, polysilicon is deposited on the stress adjustment layer 140 to form a rigid film having conductive properties, that is, the upper electrode layer 150 serves as a back plate of the MEMS microphone.

Photolithography and etching are performed on the upper electrode layer 150 to form the acoustic holes 170 and the second through hole 151. The acoustic holes 170 are uniformly distributed on the upper electrode layer 150. Of course, the acoustic holes 170 may also be non-uniformly distributed. For example, the acoustic holes 170 may be relatively dense in the middle region of the upper electrode layer 150. The stress layer 140 is typically located at the periphery of the vibration active area of the upper electrode layer 1150 or the lower electrode layer 120 so as not to affect the stress level of the diaphragm or the back plate.

Still, photolithography and etching are performed on the upper electrode layer 150, and a third through hole 131 is formed on the sacrificial layer 130 corresponding to the second through hole. A first pad 181 is formed on a side of the upper electrode layer (back plate) 150, and a second pad 183 is formed on a lower electrode layer (diaphragm) 120 corresponding to the third through hole. The first pad 181 and the second pad 183 are used to connect the lower electrode layer (diaphragm) 120 and the upper electrode layer (back plate) 150, and the first pad 181 and the second pad 183 may also be used for subsequent capacitive silica-based microphone packaging wiring.

In step S440: a first opening is defined on the substrate.

Figure 12:
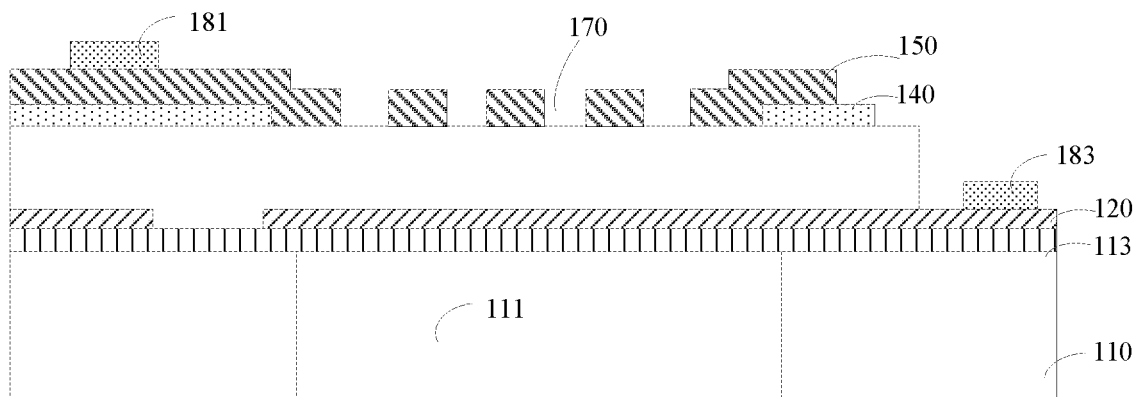

Referring to FIG. 12, the surface of the substrate 110 facing away from the lower electrode layer 120 (the second main surface) is ground to reduce the thickness of the substrate 110 to a desired thickness; and a first opening 111 is defined on the second main surface by a process such as photolithography and etching. The first opening 111 is also referred to as the back cavity. The insulating layer 113 serves as a stop layer for etching the back cavity 111.

In step S450: a second opening is defined on the sacrificial layer corresponding to the vibration active area.

Referring to FIG. 2, the sacrificial layer corresponding to the vibration active area undergoes a release process to define a second opening 160 so that the lower electrode layer 120, the sacrificial layer 130, the stress layer 140, and the upper electrode layer 150 are enclosed to form a cavity. The release means that the sacrificial layer 130 is etched away in a specific region (position corresponding to the vibration active region of the lower electrode layer or the lower motor layer of the diaphragm) by an etching process, and an MEMS microphone device is finally formed.

In another embodiment, the preparation process flow of the MEMS microphone is as follows, which will be described with reference to FIGS. 13 to 18.

In step S410, a lower electrode layer, a sacrificial layer, and a stress layer are sequentially deposited on the substrate.

Figure 13:
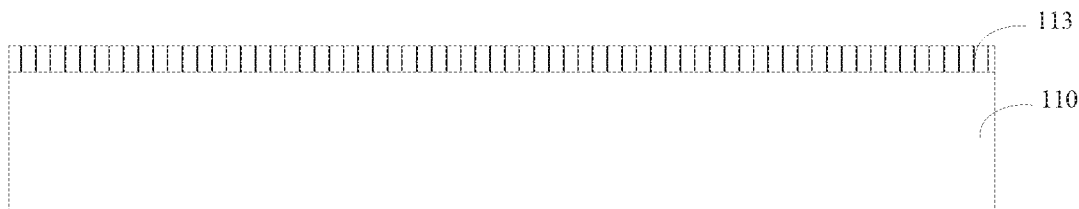
FIGS. 13-18 are cross-sectional views illustrating the manufacturing process of the MEMS microphone in another embodiment.

Referring to FIG. 13, a substrate 110 is provided. The substrate 110 is made of Si. The substrate 110 may also be made of other semiconductors or semiconductor compounds, such as one of Ge, SiGe, SiC, $SiO_2$ or $Si_3N_4$. A silicon oxide insulating layer 113 is formed on the surface (first main surface) of the substrate 110 by thermal growth, and the thickness of the silicon oxide insulating layer 113 is between 0.5 μm and 1 μm. Polysilicon is then deposited on the surface of the silicon oxide insulating layer 113 to form the lower electrode layer 120. Next, polysilicon is deposited on the surface of the silicon oxide insulating layer 113 to form the lower electrode layer 120. At this time, the lower electrode layer 120 is a rigid film and the lower electrode layer 120 serves as a back plate of the MEMS microphone. In other embodiments, the lower electrode layer 120 may also be a composite conductive layer containing Si, Ge, SiGe, SiC, or Al, W, Ti, or nitrides of Al, W, Ti.

Figure 14:
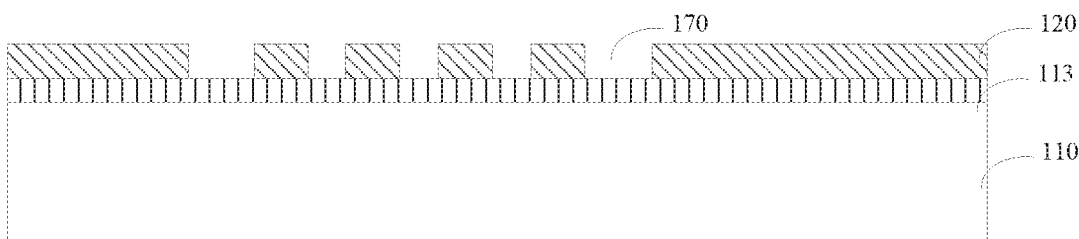
Figure 15:
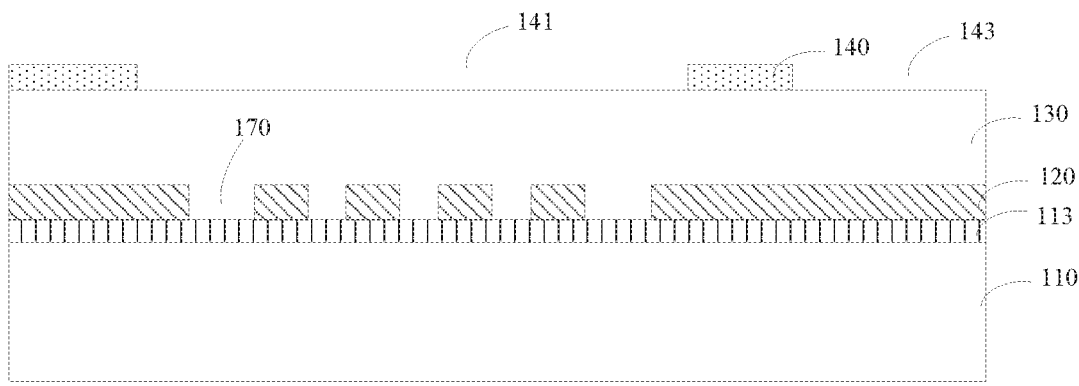

Referring to FIGS. 14-15, photolithography and etching are performed on the lower electrode layer 120 to form acoustic holes 170. The acoustic holes 170 are evenly distributed on the lower electrode layer 120. Of course, the acoustic holes 170 may also be non-uniformly distributed. For example, the acoustic holes 170 may be relatively dense in the middle region of the lower electrode layer 120. An oxide layer is then deposited on the lower electrode layer 120 serving as a sacrificial layer 130, and a layer of silicon nitride is deposited serving as a stress layer 140 on the sacrificial layer 130. Since the thickness of the sacrificial layer of the MEMS microphone is usually in the range of 3 to 5 μm, the sacrificial layer 130 with such a thickness will cause severe deformation of the MEMS microphone semiconductor substrate 110. In the process of preparation, the press of the stress layer 140 or the film thickness of the stress layer 140 can be controlled according to the warpage or the deformation of the substrate 110. In other words, by changing the thickness and the stress of the stress layer 140, a force opposite to the direction of the deformation of the substrate may be applied to the substrate so as to reduce or eliminate the deformation of the substrate. The stress layer 140 is a silicon nitride ($Si_3N_4$) layer, and the stress direction of the silicon nitride ($Si_3N$) layer is opposite to the stress that causes the substrate 110 to warp. The stress of the stress layer 140 may be adjusted by adjusting deposition process parameters such as temperature, pressure, gas volume (total reaction gas volume and ratio of reactant gas components), radio frequency power and frequency, and the like in depositing.

In step S420: A vibration active region of the upper electrode layer is formed in the stress layer.

Referring to FIG. 15, then through photolithography and etching steps, a vibration active region 141 of the upper electrode layer (diaphragm) 150 is formed on the stress layer 140, and the first through hole 143 is formed by etching. The vibration active region can be understood to mean that the upper electrode layer 150 serving as a diaphragm in the MEMS microphone has a space that can deform to a certain degree when the surrounding air vibrates.

In step S430, an upper electrode layer is deposited on the stress layer.

Figure 16:
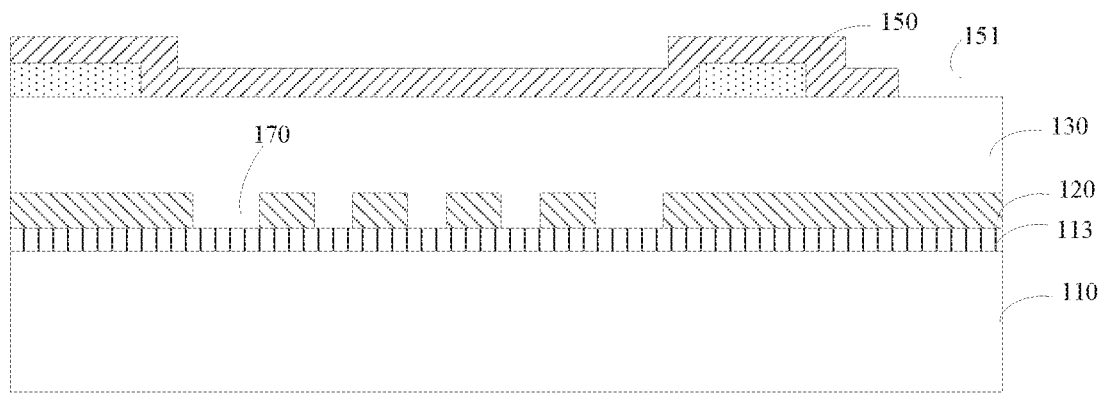
Figure 17:
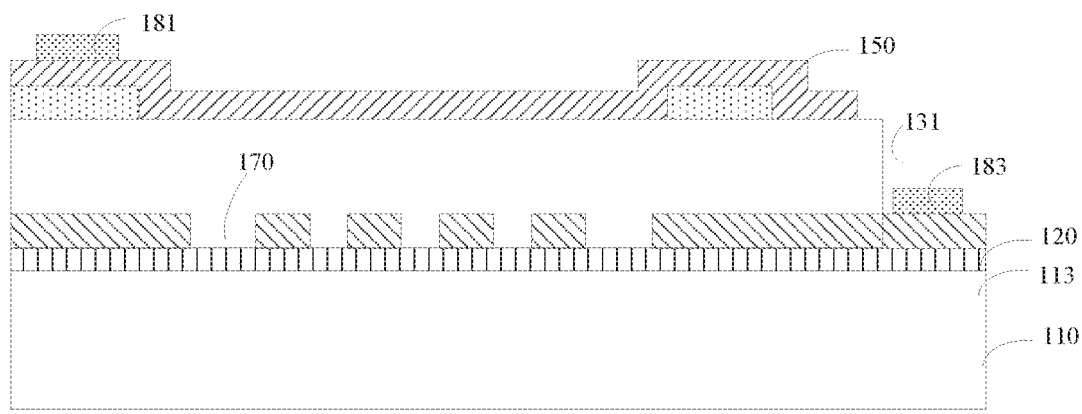

Referring to FIG. 16, polysilicon is deposited on the stress layer 140 to form a flexible thin film having conductive properties, that is, the upper electrode layer 150, which serves as a diaphragm of the MEMS microphone. The stress layer 140 is typically located at the periphery of the vibration active area of the upper electrode layer 150 or the lower electrode layer 120 so as not to affect the stress level of the diaphragm or the back plate. Then, photolithography, etching, and other processes are performed to form the desired pattern and the second through hole 151. Then, a third through hole 131 is formed in the second through hole 151 on the sacrificial layer 130 through a photolithography and etching process. Referring to FIG. 17, a first pad 181 is formed on a side of the upper electrode layer (diaphragm) 150, and a second pad 183 is formed on a lower electrode layer (back plate) 120 corresponding to the third through hole. The first pad 181 and the second pad 183 are used to connect the lower electrode layer (diaphragm) 120 and the upper electrode layer (back plate) 150, and the first pad 181 and the second pad 183 may also be used for subsequent capacitive silica-based microphone packaging wiring.

In step S440: a first opening is defined on the substrate.

Figure 18:
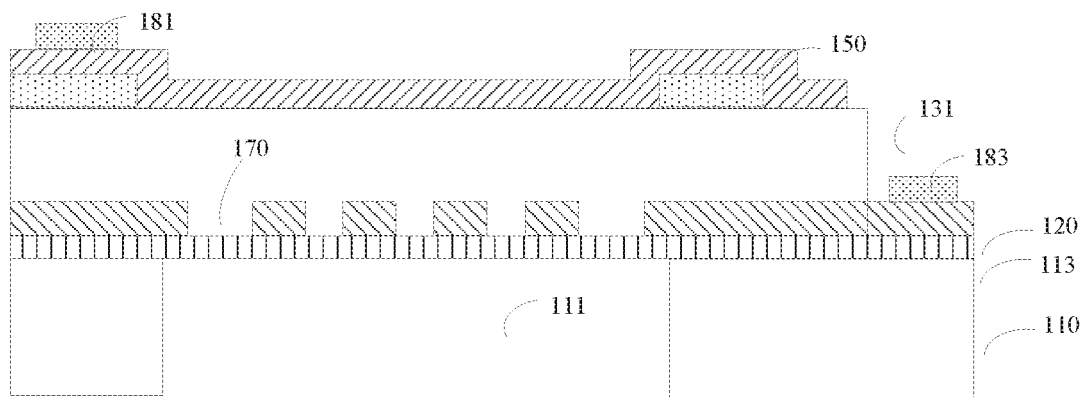

Referring to FIG. 18, the surface of the substrate 110 facing away from the lower electrode layer 120 (the second main surface) is ground to reduce the thickness of the substrate 110 to a desired thickness; and a first opening 111 is defined on the second main surface by a process such as photolithography and etching. The first opening 111 is also referred to as back cavity. The insulating layer 113 serves as a stop layer for etching the back cavity 111.

In step S450, a second opening is defined on the sacrificial layer corresponding to the vibration active area, and the second opening is corresponding to the first opening.

Referring to FIG. 3, the sacrificial layer corresponding to the vibration active area undergoes a release process to define a second opening 160 so that the lower electrode layer 120, the sacrificial layer 130, the stress layer 140, and the upper electrode layer 150 are enclosed to form a cavity. The release means that the sacrificial layer 130 is etched away in a specific region (position corresponding to the vibration active region of the lower electrode layer or the lower motor layer of the diaphragm) by an etching process, and an MEMS microphone device is finally formed.

Finally, it should be noted that the substrate 100 represents a support structure that provides support and does not necessarily represent that the substrate 100 is a separate component. The substrate 100 may be represented as a multi-layer structure, and its multi-layer structure may be formed by a process such as epitaxy, deposition, or bonding.

The above MEMS microphone includes a substrate, a lower electrode layer, a sacrificial layer, a stress layer, and an upper electrode layer. The stress or thickness of the stress layer matches the warping degree of the substrate, by changing the thickness and the stress value of the stress layer, a force opposite to the deformation direction of the substrate can be applied to the substrate so as to reduce or eliminate the deformation of the substrate. At the same time, the method of manufacturing the MEMS microphone can be perfectly compatible with the existing manufacturing process of MEMS microphones, which facilitates production, does not require the purchase of special requirements substrates, and has a low cost. At the same time, it can effectively reduce the risk of scratches and contamination on the front surface of the MEMS microphone substrate, and the product yield is high.

The different technical features of the above embodiments can have various combinations which are not described for the purpose of brevity. Nevertheless, to the extent the combining of the different technical features do not conflict with each other, all such combinations must be regarded as being within the scope of the disclosure.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. An MEMS microphone, comprising a substrate, a lower electrode layer, a sacrificial layer, a stress layer on the sacrificial layer, and an upper electrode layer; wherein the substrate defines a first opening in a middle portion thereof, the lower electrode layer spans the substrate; the sacrificial layer, the stress layer, and the upper electrode layer are sequentially laminated on the lower electrode layer; a thickness of the sacrificial layer is in the range of 3 to 5 μm, the sacrificial layer and the stress layer define a second opening corresponding to the first opening, whereby the substrate warps; a stress direction of the stress layer is opposite to a warping direction of the substrate, wherein the stress layer is made by adjusting deposition process parameters to adjust a stress property of the stress layer, wherein the deposition process parameters are selected from the group consisting of temperature, pressure, gas volume (total reaction gas volume and ratio of reactant gas components), and radio frequency power and frequency.

2. The MEMS microphone according to claim 1, wherein the stress layer is located at a periphery of a vibration active area of the upper electrode layer or the lower electrode layer, and the vibration active area is a position corresponding to the second opening.

3. The MEMS microphone according to claim 1, wherein the upper electrode layer is a flexible film serving as a diaphragm, and the lower electrode layer is a rigid film serving as a back plate, wherein the back plate is provided with a plurality of acoustic holes.

4. The MEMS microphone according to claim 1, wherein the upper electrode layer is a rigid film serving as a back plate, and the lower electrode layer is a flexible film serving as a diaphragm, wherein the back plate is provided with a plurality of acoustic holes.

5. The MEMS microphone according to claim 1, wherein both the upper electrode layer and the lower electrode layer are either made of polysilicon or are composite layers containing polysilicon.

6. The MEMS microphone according to 1, wherein the sacrificial layer is further provided with a notch configured to expose the lower electrode layer below the sacrificial layer;
wherein the MEMS microphone further comprises a first pad and a second pad;
wherein the first pad is disposed on a side of the upper electrode layer, and the second pad is disposed on the exposed lower electrode.

7. The MEMS microphone according to claim 1, wherein an insulating layer is further provided on the substrate, the lower electrode layer spans and is connected to the insulating layer, such that the substrate and the lower electrode layer are insulated from each other.

8. The MEMS microphone according to claim 1, wherein a thickness or a stress value of the stress layer is configured to match the warpage of the substrate, and wherein the warping of the substrate defines a degree of bending of a plane in space and is numerically defined as the distance between the furthest two points of the warping plane in a height direction.

9. The MEMS microphone according to claim 8, wherein by changing the thickness or the stress value of the stress layer, a force opposite to the warping direction of the substrate can be applied to the substrate so as to reduce or eliminate the deformation of the substrate.

10. The MEMS microphone according to claim 1, wherein the stress layer is a silicon nitride ($Si_3N_4$) layer, and wherein the stress direction of the silicon nitride ($Si_3N_4$) layer is opposite to the stress that causes the substrate to warp.

11. The MEMS microphone according to claim 1, wherein the stress layer applies a force opposite to the direction of the warping direction of the substrate may be applied so as to reduce or eliminate the deformation of the substrate.

12. A method of manufacturing an MEMS microphone, comprising:
depositing a lower electrode layer, a sacrificial layer, and a stress layer sequentially on a substrate, wherein a stress direction of the stress layer is opposite to a warp direction of the substrate, wherein the stress layer is made by adjusting deposition process parameters to adjust a stress property of the stress layer, wherein the deposition process parameters are selected from the group consisting of temperature, pressure, gas volume (total reaction gas volume and ratio of reactant gas components), and radio frequency power and frequency;
forming a vibration active region of an upper electrode layer on the stress layer;
depositing an upper electrode layer on the stress layer;
defining a first opening on the substrate; and
defining a second opening on the sacrificial layer corresponding to the vibration active area, wherein the second opening corresponds to the first opening and the substrate warps.

13. The method according to claim 12, wherein the upper electrode layer is a flexible film, and the lower electrode layer is a rigid film, the method further comprises forming a plurality of acoustic holes on the lower electrode layer.

14. The method according to claim 12, wherein the upper electrode layer is a rigid film, and the lower electrode layer is a flexible film, the method further comprises forming a plurality of acoustic holes on the upper electrode layer.

15. The method according to claim 12, further comprising forming a first pad on the upper electrode layer and a second pad on the lower electrode layer.

16. A method of manufacturing an MEMS microphone comprising:
depositing a lower electrode layer, a sacrificial layer, and a stress layer sequentially on a substrate, wherein a thickness of the sacrificial layer is in the range of 3 to 5 μm and a stress direction of the stress layer is opposite to a warp direction of the substrate, wherein the stress layer is made by adjusting deposition process parameters to adjust a stress property of the stress layer, wherein the deposition process parameters are selected from the group consisting of temperature, pressure, gas volume (total reaction gas volume and ratio of reactant gas components), and radio frequency power and frequency;
forming a vibration active region of the lower electrode layer on the stress layer;
depositing an upper electrode layer on the stress layer;
defining a first opening on the substrate; and
defining a second opening on the sacrificial layer corresponding to the vibration active area, wherein the second opening is corresponding to the first opening and the substrate warps.

17. The method according to claim 16, wherein the upper electrode layer is a flexible film, and the lower electrode layer is a rigid film, the method further comprises forming a plurality of acoustic holes on the lower electrode layer.

18. The method according to claim 16, wherein the upper electrode layer is a flexible film, and the lower electrode layer is a rigid film, the method further comprises forming a plurality of acoustic holes on the upper electrode layer.

19. The method according to claim 16, further comprising forming a first pad on the upper electrode layer and a second pad on the lower electrode layer.

\* \* \* \* \*